United States Patent
Herchen et al.

(10) Patent No.: US 6,248,206 B1
(45) Date of Patent: *Jun. 19, 2001

(54) APPARATUS FOR SIDEWALL PROFILE CONTROL DURING AN ETCH PROCESS

(75) Inventors: Harald Herchen, San Jose; Michael D Welch, Livermore; William Brown, San Jose; Walter Richardson Merry, Santa Clara, all of CA (US)

(73) Assignee: Applied Materials Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/724,660

(22) Filed: Oct. 1, 1996

(51) Int. Cl.[7] .................................................. C23F 1/02
(52) U.S. Cl. .................. 156/345; 118/712; 118/723 ER; 118/723 IR; 118/723 ME
(58) Field of Search ..................... 118/723 MW, 118/723 ME, 723 MR, 723 E, 723 ER, 723 I, 723 IR, 723 AN, 723 MA, 712, 713; 156/345; 315/111.21, 111.41, 111.51

(56) References Cited

U.S. PATENT DOCUMENTS

| | | | |
|---|---|---|---|
| 4,891,118 | * 1/1990 | Ooiwa et al. | 204/298 |
| 4,960,073 | * 10/1990 | Suzuki et al. | 118/723 |
| 5,160,397 | * 11/1992 | Doki et al. | 156/345 |
| 5,181,986 | * 1/1993 | Ooiwa | 156/643 |
| 5,385,624 | * 1/1995 | Ameniya et al. | 156/345 |
| 5,611,863 | * 3/1997 | Miyagi | 118/723 MP |
| 5,626,679 | * 5/1997 | Shimiuz et al. | 119/723 MR |
| 5,739,051 | * 4/1998 | Saito | 438/16 |
| 5,916,455 | * 6/1999 | Kumagai | 216/68 |

* cited by examiner

*Primary Examiner*—Gregory Mills
*Assistant Examiner*—Luz Alejandro
(74) *Attorney, Agent, or Firm*—Glenn Patent Group

(57) ABSTRACT

A process is provided for controlling the slope of the sidewalls of an opening produced in a semiconductor wafer during an etch process. Microwave or radio frequency energy is remotely applied to pre-excite a process gas. Radio frequency energy is also supplied to the process gas within the process chamber. The sidewall slope is varied by varying the ratio of the amount of remote microwave or radio frequency energy supplied and that of the radio frequency energy supplied within the process chamber. The sidewall slope is also shaped by controlling the process gas flow rate and composition, and the pressure within the process chamber. A more vertical, anisotropic etch profile is obtained with increased radio frequency energy and lower process chamber pressure. A more horizontal, isotropic profile is obtained with decreased radio frequency energy and higher process chamber pressure. A narrower etched feature having smaller interlayer and active element contact regions than the corresponding feature size on the overlying photoresist layer may thereby be provided.

8 Claims, 4 Drawing Sheets

APPARATUS FOR SIDEWALL PROFILE CONTROL DURING AN ETCH PROCESS

BACKGROUND OF THE INVENTION

1. Technical Field

The invention relates to plasma processing. More particularly, the invention relates to a plasma etch process for controlling the profile of an etched sidewall.

2. Description of the Prior Art

Plasma processing is an essential tool of the semiconductor manufacturing industry. In a plasma etch process, electromagnetic radiation is used to dissociate the molecules of process gas to produce a reactive species. i.e. a plasma. The plasma is directed to the surface of a workpiece, such as a semiconductor wafer, in a process environment, typically a vacuum chamber. The wafer is masked with a photoresist material to define a circuit pattern. The plasma etches openings into unmasked portions of the wafer. The slope or profile of these openings varies according to the choice of plasma precursor process gases. Thus, an isotropic process etches equally in all directions, while an anisotropic process etches primarily in one direction. For example, processes such as reactive ion etch ("RIE") permit the anisotropic etching of small openings having high aspect ratios. Smaller device features may thereby be produced.

FIG. 1 illustrates a typical RIE apparatus, according to the prior art. A wafer support 12 is located within the process chamber 10. The wafer support is connected to a radio frequency ("RF") power source 14 and serves as a cathode. The walls 16 and base 18 of the chamber form the grounded anode of the system.

Gas supplied to the chamber through an inlet port 20 passes through a gas distribution plate 22 and is directed to the surface of the workpiece 24. The RF energy supplied to the process chamber dissociates the molecules of the process as to produce a reactive species that is used to etch the workpiece.

Alternately, the plasma may be remotely generated in an applicator 26 by application of a microwave ("MW") or RF power source 28. The remotely generated plasma is then ported to the process chamber. An anisotropic etch is achieved as the amount of RF energy supplied to the electrodes is increased. The spent process gas is then exhausted from the process chamber through an outlet port 30 by a vacuum pump 32.

It is often desirable to control the profile of the sidewalls of the etched opening. For example, sloped sidewalls are desired when an opening is made in a dielectric layer, such as silicon oxide, for the deposition of metal. It is known to use various etchant mixtures to produce sloped sidewalls. However, such processes are generally difficult to control, such that the resulting openings are non-uniform. Further, it is difficult to provide smaller interlayer and active element contact regions than the corresponding feature size on the overlying photoresist layer. Rather, the etch process tends to etch under the photoresist, thereby producing an opening having a larger diameter than that of the masked region of the wafer.

It would therefore be advantageous to provide a process for controlling the profiles of sidewalls formed when etching a workpiece. It would be a further advantage if such process provided smaller interlayer and active element contact regions than the corresponding feature size on the overlying photoresist layer.

SUMMARY OF THE INVENTION

The invention provides a process for controlling the profile of the sidewalls in an opening that is etched in a semiconductor wafer. Microwave or radio frequency energy is remotely applied to pre-excite a process gas that is used in a process chamber. Radio frequency energy is also supplied to a process gas within the process chamber. The sidewall profile is controlled by independently varying the ratio of remote microwave or radio frequency energy supplied to that of the radio frequency energy supplied within the process chamber. The sidewall profile is also controlled by varying the process gas flow rate and composition, and the pressure within the process chamber. For example, a more vertical, anisotropic etch profile is obtained by providing increased radio frequency energy to the process chamber, while operating the process chamber at a lower pressure. Likewise, a more horizontal, isotropic profile is obtained by supplying decreased radio frequency energy to the process chamber, while operating the process chamber at a higher pressure. The same process chamber may thereby be used for both isotropic and anisotropic etching processes.

As the etch process progresses, the radio frequency component supplied to the process chamber is varied to provide an etched feature that is narrower than the overlying photoresist pattern. Interlayer and active element contact regions may thus be provided that are smaller than the corresponding feature size on the overlying photoresist layer. Further, the etch profile may be varied within a single etch process by supplying a programmed energy/pressure profile to the process chamber.

DETAILED DESCRIPTION OF THE INVENTION

The invention provides a process for controlling the profile of the sidewalls of an opening etched in a semiconductor wafer.

Figure 1:
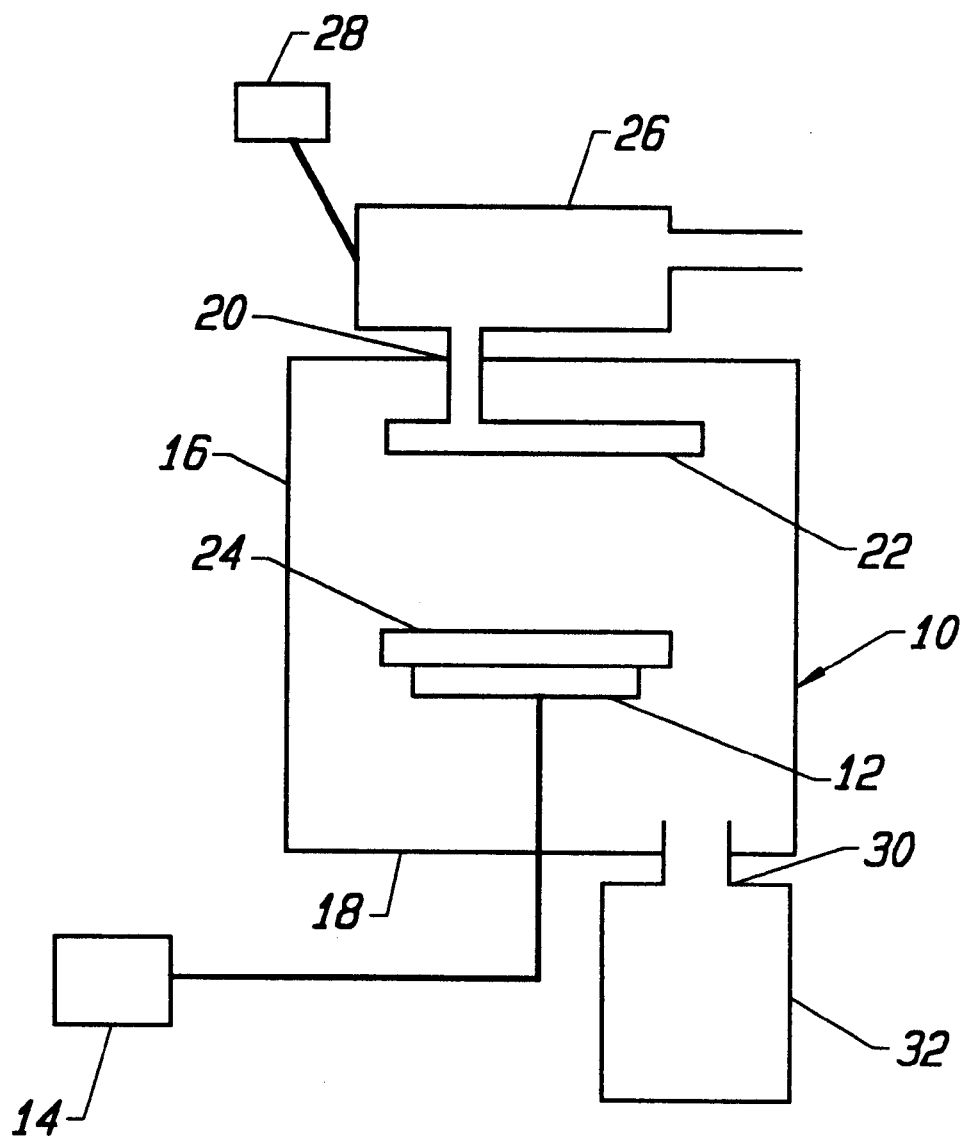
FIG. 1 is a cross-sectional schematic view of a reactive ion etch apparatus according to the prior art.
Figure 2:
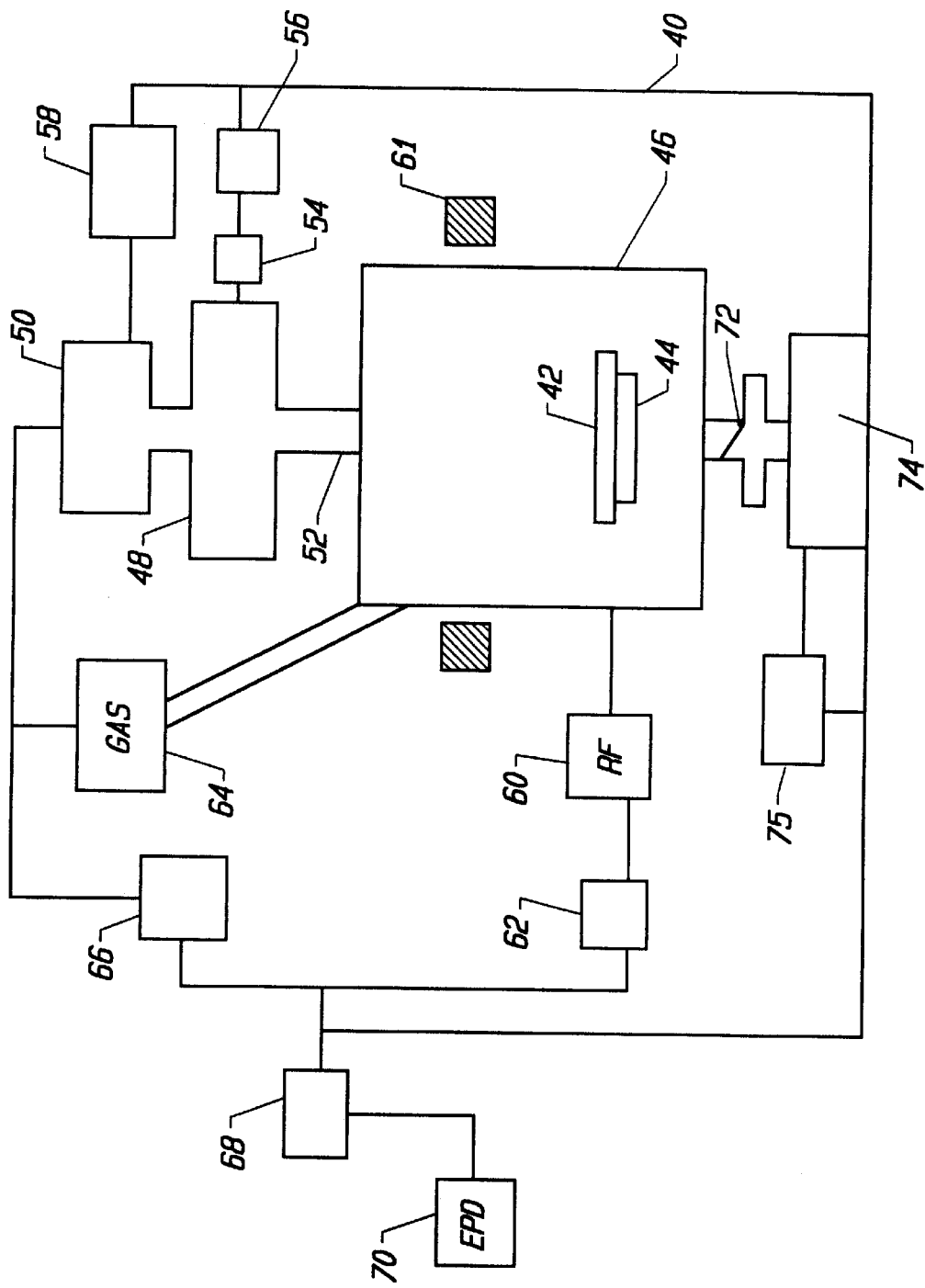
FIG. 2 is a block diagram of a reactive ion etch apparatus according to the invention.

FIG. 2 is a block diagram of a reactive ion etch apparatus 40 according to the invention. Within the process chamber 46, a workpiece 42 is supported on a cathode/support 44. A process gas is supplied to an applicator 48 from a first gas source 50. In a preferred embodiment of the invention, a module 58 is provided to variably control the flow of process gas from the applicator. The applicator tube may be of any known configuration, such as a conventional sapphire tube, or that described in U.S. patent application Ser. No. 08/499, 984, H. Herchen, *Microwave Plasma Based Applicator* (filed Jul. 10, 1995) and commonly assigned to Applied Materials, Inc.

Electromagnetic energy from a first energy source 54 is remotely applied to the process gas in the applicator. The source of electromagnetic energy may be either an RF signal and or a microwave signal (typically having a frequency of 2.45 GHz). A first variable control module 56 may be provided to manually or automatically adjust the frequency and power of the electromagnetic energy. In a preferred embodiment of the invention, this MW or RF energy does not generate a plasma within the applicator. Rather, the applied energy pre-excites the reactive gas to a higher energy level. In an alternate embodiment of the invention, a plasma is remotely generated in the applicator.

The pre-excited gas is then ported from the applicator through an inlet 52 into the process chamber, and then directed to the surface of the workpiece. Radio frequency energy from a second energy source 60 is also applied to the pre-excited gas within the process chamber. This second energy source may be supplied to the pre-excited process gas (or plasma) supplied to the process chamber from the applicator simultaneously with the application of electromagnetic or microwave energy to the applicator.

A magnetic coil 61 may be provided surrounding the process chamber to help control the plasma during RIE. A second variable control module 62 may be provided to manually or automatically adjust the frequency and power of the RF energy from the second source.

Greater excitation levels in the applicator increase the etch rate in the chamber. This is a result of the larger quantity of reactive species that are formed within the applicator at higher energy levels. There are several advantages to pre-exciting the remote gas. One advantage is that, because less RF power is required in the chamber to generate a plasma, the heat-loading on the workpiece is decreased. Better etch uniformity is thereby provided and there is less likelihood that the delicate features formed on the wafer can be damaged by exposure to excessive levels of heat. Additionally, the RF power remaining after the plasma has been generated may be used to put a bias on the workpiece, and thereby direct the reactive species downwards to the wafer instead of to the side of the chamber.

The amount of power that must be supplied to the process chamber RF source is dependent upon such factors as the size of both the workpiece and the process chamber, as well as the material that is to be etched. In the preferred embodiment of the invention, RF energy in the range of about 300–1500 watts is applied to the process chamber during the etch of an 8-inch wafer. Lower power levels may be applied if some or all of the process gas is pre-excited. These lower levels average approximately 150–750 watts. For an 8-inch wafer, the preferred power range for the applicator is about 600–3,000 watts.

In the preferred embodiment of the invention, a second process gas source 64 is provided to supply a process gas directly to the process chamber (in addition to the process gas that is supplied to the process chamber via the applicator). A module 66 may be provided to variably control the flow of this second process gas to the process chamber from the second source. The RF energy is applied to both the pre-excited gas supplied by the applicator and to the process gas supplied to the process chamber by the second source 64.

The process gas may comprise such gases as $CHF_3$, $CF_4$, $NF_3$, $O_2$, and $Cl_2$. Other gases typically used in RIE-type etch include fluorine-bearing gases, bromine, oxygen, nitrogen, and argon. The same or different types of gases may be supplied by the first and second sources, depending upon such factors as the etch profile desired, the feature size, and the material to be etched.

Pressure within the process chamber is typically controlled by a throttle valve 72 connected to a vacuum pump 74. A variable control module 75 may also be provided to control the pressure within the chamber. This module may be manually or automatically controlled.

In one embodiment of the invention, a master control module 68 is provided to regulate the variable control modules for the electromagnetic energy source 56, the chamber pressure 72, the gas flows 58,66, and the process chamber RF power source 62. The master control module may be a manual or automatic control. Thus, any number of predefined etch profiles for various materials and features sizes may be programmed into the master control module, and a desired etch profile may be selected without any need for undue experimentation. Programmable controllers as would be suitable for this application are well known in the art, as is the independent control of such process parameters as process gas flow rates, chamber pressure, and energy levels.

A monitoring device, such as an end point detector 70, may be connected to the process chamber to monitor the progression of the etch process. In the preferred embodiment of the invention, the endpoint detector is connected to the master control module. The variable control modules may thereby be directed to adjust, for example, the gas flow and RF energy level in accordance with the process progression to achieve the desired profile.

The profile of the etched sidewalls is varied by independently varying the ratio of the amount of remote microwave or radio frequency energy supplied to the process to that of radio frequency energy supplied to the process chamber. The sidewall profile is also shaped by controlling the gas flow rates and composition, and the pressure within the process chamber. The parameters of these process variables may be adjusted as necessary during the etch process to assure that the process produces a desired sidewall profile. Thus, a more vertical, anisotropic sidewall profile is obtained by providing increased radio frequency energy and a lower process chamber pressure. In such case, more reactive species are directed downwards towards the workpiece. A more horizontal, isotropic profile is obtained by providing decreased radio frequency energy and at a higher process chamber pressure. In such case, the reactive species are directed more sideways along the workpiece. While the profile of the sidewall cannot slope past vertical, it is possible to increase and decrease the profile of the sidewall during the etch process, and thereby produce an opening having a slope that varies along the length of the opening.

High process gas flow rates and process chamber pressures are needed to obtain isotropically-etched sidewalls having a shallow slope. Such high process gas flow rates may reach approximately 1–2 liters/minute of total gas flow with a process chamber pressure approaching approximately 3 torr. Steeper, anisotropically-etched slopes are achieved with lower process gas flow rates and process chamber pressures. These low process gas flow rates may reach approximately 0.04 liters/minute with a process chamber pressure approaching approximately 100 millitorr. It should be appreciated that the invention therefore provides a wide variety of sidewall etch profiles, depending upon the interaction of such factors as pre-excitation of a process gas, RF energy levels supplied to the process chamber, process gas flow rates and composition, and process chamber pressure.

Alternate embodiments of the invention are described in the following Examples.

Figure 3:
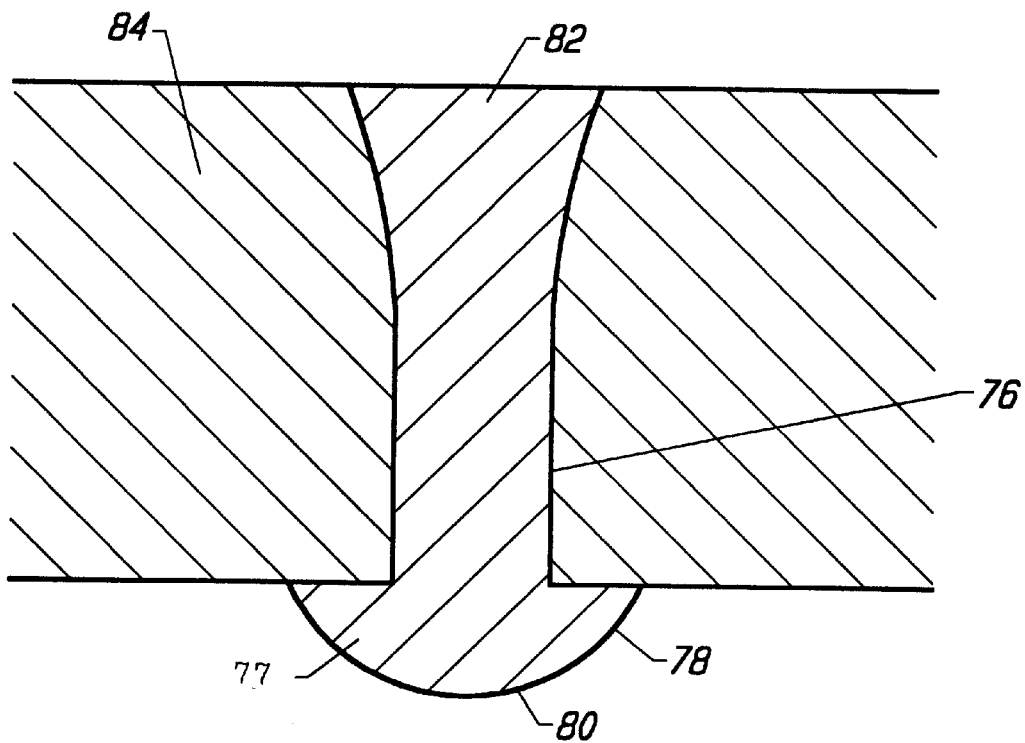
FIG. 3 is a cross-sectional side view of an etched opening according to the invention.
Figure 4:
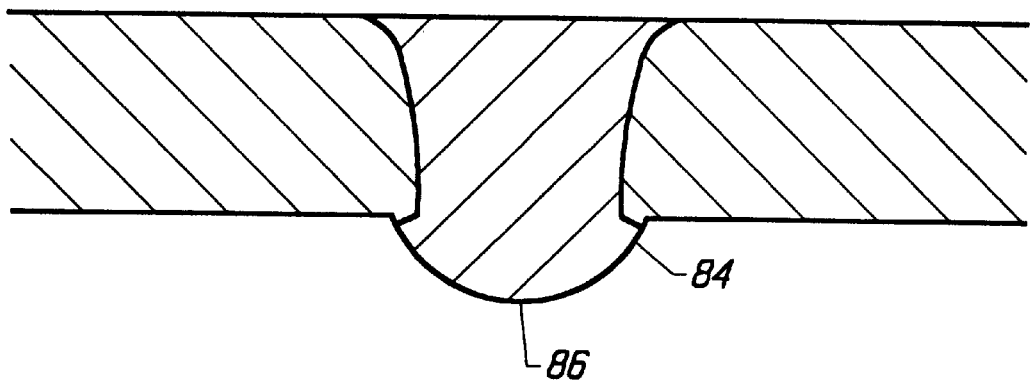
FIG. 4 is a cross-sectional side view of an etched opening according to the invention.

FIGS. 3 and 4 are cross-sectional side views of etched openings, according to Examples 1 and 2, respectively, of the invention.

TABLE

|  | Example 1 | Example 2 |
|---|---|---|
| Microwave power, watts | 600 | 1000 |
| Pressure, millitorr | 650 | 380 |
| RF power, watts | 500 | 1000 |
| $NF_3$, sccm | 135 | 84 |
| $CF_4$, sccm | 270 | 169 |
| $O_2$, sccm | 76 | 47 |
| $NF_3:CF_4$ | 0.5 | 0.5 |
| Etch time, secs. | 315 | 184 |

In Example 1, illustrated by FIG. 3, low MW power was applied remotely and low RF power was supplied to the chamber. The chamber was maintained under high pressure. The use of low power and high pressure provided a near-horizontal, isotropic etch of the silicon oxide 77 layer, below the photoresist layer 84 of the workpiece 76. Sidewalls 78 are smoothly tapered and the bottom 80 of the opening 82 is relatively flat.

By contrast, in Example 2, illustrated by FIG. 4, higher power and lower pressure were applied. The resulting profile shows increased anisotropic etching, with more vertical sidewalls 84 and a flat bottom 86.

EXAMPLE 3

An opening was etched in silicon oxide deposited from tetraethoxysilane ("TEOS") using a total gas flow of 1500 sccm. The $NF_3:CF_4$ ratio was 0.2, and the $O_2:CF_4$ ratio was 0.32. The wafer support temperature was maintained at 100° C. using helium at 4 Torr to cool the wafer. 1400 Watts of power were applied to the MW source. Etching continued for 133 seconds.

Figure 5:
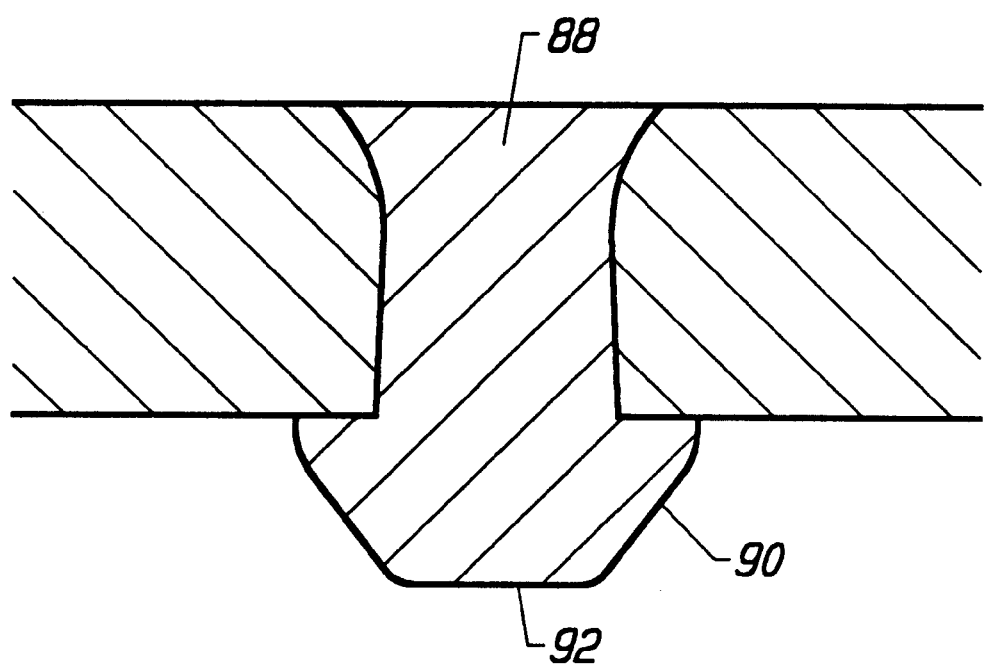
FIG. 5 is a cross-sectional side view of an etched opening according to the invention.

FIG. 5 is a cross-sectional side view of an etched opening produced in accordance with Example 3 of the invention. A etched opening 88 was obtained, with smoothly tapered sidewalls 90 and a flat bottom 92. Thus, as higher increased energy levels are applied to the gas source, a near-vertical, anisotropic etch profile is achieved.

As the etch progresses, the radio frequency component supplied to the process chamber may be controlled to produce a narrower etched feature than the overlying photoresist pattern. Smaller interlayer and active element contact regions than the corresponding feature size on the overlying photoresist layer may thereby be provided. This narrower end hole may be achieved without reflowing the sidewalls, and without having to use narrower holes in the photoresist. The invention therefore eliminates process steps, thus reducing the time and costs of fabrication.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

What is claimed is:

1. A system for controlling a sidewall profile of an opening formed in a workpiece during an etch process in a process chamber, comprising:

a first process gas source;

a first process gas supplied by said first process gas source;

a first energy source for pre-exciting said process gas, said first energy source located and configured to pre-excite said process gas at a location that is remote from said process chamber;

a variable control module for said first energy source;

a port formed in a wall of said process chamber for introducing said pre-excited process gas into said process chamber;

a second energy source located and configured for applying energy to said pre-excited first process gas within said process chamber to generate a plasma therein;

a variable control module for said second energy source; and a master control module for regulating both said variable control module for said first energy source and said variable control module for said second energy source, said master control module having a selectable predefined etch profile program, to independently vary a ratio of application of energy by said first and second energy sources based upon said selectable predefined etch profile program to influence said sidewall profile of said opening formed in said workpiece.

2. The system of claim 1, further comprising:

a variable control module, responsive to said master control module, for controlling the flow of said process gas into said process chamber to influence said sidewall profile.

3. The system of claim 1, further comprising:

a variable control module, responsive to said master control module, for controlling pressure within said process chamber to influence said sidewall profile.

4. The system of claim 1, further comprising:

a second gas source for injecting a second process gas directly into said process chamber.

5. The system of claim 1, further comprising:

a magnet surrounding said process chamber.

6. The system of claim 1, further comprising:

an endpoint detector system for monitoring process progression in said process chamber.

7. The system of claims 1, wherein said master control module regulates any of said application of energy, said gas flow rate, and said process chamber pressure based upon said selectable predefined etch profile program.

8. The system of claim 1, wherein said master control module is responsive to an endpoint detector system.

* * * * *